US005083112A

United States Patent [19]

Piotrowski et al.

[11] Patent Number: 5,083,112

[45] Date of Patent: Jan. 21, 1992

[54] MULTI-LAYER THIN-FILM EAS MARKER

[75] Inventors: Chester Piotrowski; Charles L. Bruzzone; T050832716g-Long; Jerome W. McAllister, all of St. Paul, Minn.

[73] Assignee: Minnesota Mining and Manufacturing Company, St. Paul, Minn.

[21] Appl. No.: 531,835

[22] Filed: Jun. 1, 1990

[51] Int. Cl.[5] ........................ G08B 13/14; G11C 11/15

[52] U.S. Cl. .................................... 340/572; 340/551; 365/173

[58] Field of Search ................ 340/572, 551; 360/113; 365/173

[56] References Cited

U.S. PATENT DOCUMENTS 3,576,552 4/1971 Vinal .................................. 365/173
4,012,781 3/1977 Lin ...................................... 360/113
4,112,503 9/1978 Lins ................................ 365/173 X
4,356,523 10/1982 Yeh ..................................... 360/113
4,698,711 10/1987 Vinal ................................... 360/113
4,825,197 4/1989 Church et al. ....................... 340/572
4,960,651 10/1990 Pettigrew et al. ............. 340/572 X

*Primary Examiner*—Jin F. Ng
*Assistant Examiner*—Thomas J. Mullen, Jr.
*Attorney, Agent, or Firm*—Gary L. Griswold; Walter N. Kirn; William B. Barte

[57] ABSTRACT

A marker for use in magnetic-type electronic article surveillance systems, comprising a substrate on which are deposited a plurality of high permeability, low coercive force magnetic thin-films, each being separated from an adjacent magnetic thin-film by a non-magnetic thin-film. Each of the magnetic films have substantially the same permeability and coercive force, and the non-magnetic films are of a thickness to allow magnetostatic coupling while inhibiting exchange coupling. Accordingly, all of the magnetic thin-films reverse as a single entity and produce a sharp, readily distinguishable response.

17 Claims, 2 Drawing Sheets

MULTI-LAYER THIN-FILM EAS MARKER

FIELD OF THE INVENTION

The invention relates to magnetic-type electronic article surveillance (EAS) systems of the type in which an alternating magnetic field produced in an interrogation zone causes a remotely detectable response from a magnetic marker affixed to articles being passed through the zone, and, in particular, relates to improved magnetic marker constructions for use in such systems.

BACKGROUND OF THE INVENTION

Magnetic-type EAS systems have become commonplace in the last decade or so, being primarily used in protecting books in libraries, bookstores, etc., where such systems offer certain advantages over EAS systems operating on other principles, e.g., "RF" or "microwave" based systems. It is thus well known that such magnetic-type EAS systems typically comprise a transmitting means for producing, within an interrogation zone, a magnetic field which alternates at a predetermined frequency, markers adapted to be affixed to articles to be protected, each such marker containing a low coercive force, high permeability ferromagnetic material which responds to the interrogation field by producing harmonics of the predetermined frequency, and a detecting means for producing an appropriate alarm signal when selected harmonics are detected. Such systems are, for example, described in U.S. Pat. No. 3,665,449 (Elder et al.) and subsequent related patents, and have been marketed by Minnesota Mining and Manufacturing Company (3M) as TATTLE TAPE brand EAS systems.

The markers used in such systems have typically comprised elongated strips of polycrystalline, low coercive force, high permeability material, such as permalloy, Supermalloy, etc. (see U.S. Pat. No. 3,790,945, Fearon, and subsequent patents). It is also known to use amorphous materials having similar magnetic properties. See RE 32,427 and 32,428. Elongated strips have been used in such markers to alleviate demagnetization effects which otherwise inhibit the production of readily distinguished, very high order harmonics. While it is also suggested in the '449 patent that other shapes, such as thin, flat discs having a ratio of major dimension to thickness of at least 6,000, may similarly have a low demagnetization factor and, hence, be a useful shape for an EAS marker, such shapes have never become commercially viable.

However, the desirability of a disc, square or rectangular-shaped marker has not escaped notice. For example, it has been recognized that a response similar to that obtained from an elongated shape could be produced in a square piece of high permeability, low coercive form magnetic material by configuring the square piece into a plurality of flux collector portions and restricted cross-sectional area switching sections. Thus, while the demagnetization factor within the switching section was unfavorable, such that an inadequate response would be expected, the addition of the flux collectors caused sufficient flux to be concentrated within the switching section and overcame the otherwise unfavorable shape. See U.S. Pat. No. 4,710,754 (Montean).

Still others have sought to provide markers utilizing thin-films. Thus, for example, Fearon, U.S. Pat. No. 4,539,558 (Col. 16, lines 2-14), has proposed that an elongated marker may be formed of a strip of alternating sputtered layers of ferromagnetic materials. In that construction, each layer is separated by an evaporated coating of, for example, aluminum oxide. Fearon still emphasizes the necessity of an elongated shape and the subsequent need for appropriate orientation in an interrogation field. In a later patent (U.S. Pat. No. 4,682,154), Fearon also suggests that markers responsive in the gigahertz frequency range may include multiple micro-thin sputtered layers of ferromagnetic material, with each layer being separated by an insulating layer, such as gadolinium oxide or holmium oxide. Each of the individual ferromagnetic layers is required to be so thin as to no longer exhibit ferromagnetic behavior at room temperature. The composite layers, sandwiched between alternate layers of insulating material, is thus said to exhibit excellent ferromagnetic characteristics at the super high frequency range. Thus, for example, the individual sputtered layers are therein proposed to be about three atom layers thick.

More relevant to the present invention, it has also been proposed to overcome the demagnetization problem, which otherwise necessitates elongated marker construction, by providing a thin film of an amorphous, zero magnetostriction, ferromagnetic material. Such a thin-film, typically in the range of 1-5 um thick, is proposed to be deposited by sputtering onto an acceptable synthetic polymeric substrate, such as polyimide. See, for example, EP Application No. 295,028 (Pettigrew). A preferred construction as there set forth, having a thickness of 1 um and dimensions in the plane of the film of 3 cm by 2 cm, would have a ratio of major dimension to thickness of 20,000, thus exceeding the lower bound of 6,000 acknowledged in Elder (U.S. Pat. No. 3,665,449).

SUMMARY OF THE INVENTION

Not withstanding the mention of thin-film magnetic EAS markers in the various documents noted above, and the potential benefits, i.e., multiple direction sensitivity, reduced cost, etc., to be gained from a thin-film construction, no one has heretofore proffered a construction having commercializable potential. Such a potential is offered in the construction of the marker of the present invention, which marker comprises a laminate of a plurality of magnetic thin-films, deposited on a flexible substrate, wherein each of the magnetic thin-films is separated from an adjacent film by a non-magnetic thin-film, the laminate being formed as a result of multiple depositions on the substrate, particularly where such constructions are made via relatively high deposition rate evaporative processes.

Each of the magnetic thin-films is formed of a composition exhibiting high permeability and low coercive force, so as to enable a state of magnetization therein to reverse upon exposure to the relatively low intensity alternating magnetic fields typically associated with magnetic-type EAS systems.

Furthermore, each of the magnetic films is separated from an adjacent magnetic film by a non-magnetic thin-film not less than one nm thick, nor more than that of the adjacent magnetic films so as to allow magnetostatic coupling between the adjacent magnetic films, but which is sufficiently thick to inhibit exchange coupling therebetween.

Accordingly, the magnetization states of all of the magnetostatically coupled films may reverse substantially as a single entity upon exposure to an alternating interrogative field and produce a sharp, readily distinguishable response.

The markers of the present invention are particularly desirable in that they are both especially compact and yet afford high performance. Many examples of compact designs can be devised in addition to the square markers described above. For example, markers in circular shape, low aspect ratio rectangulars, short strips, crosses, etc., can similarly be produced.

DETAILED DESCRIPTION

Figure 1:
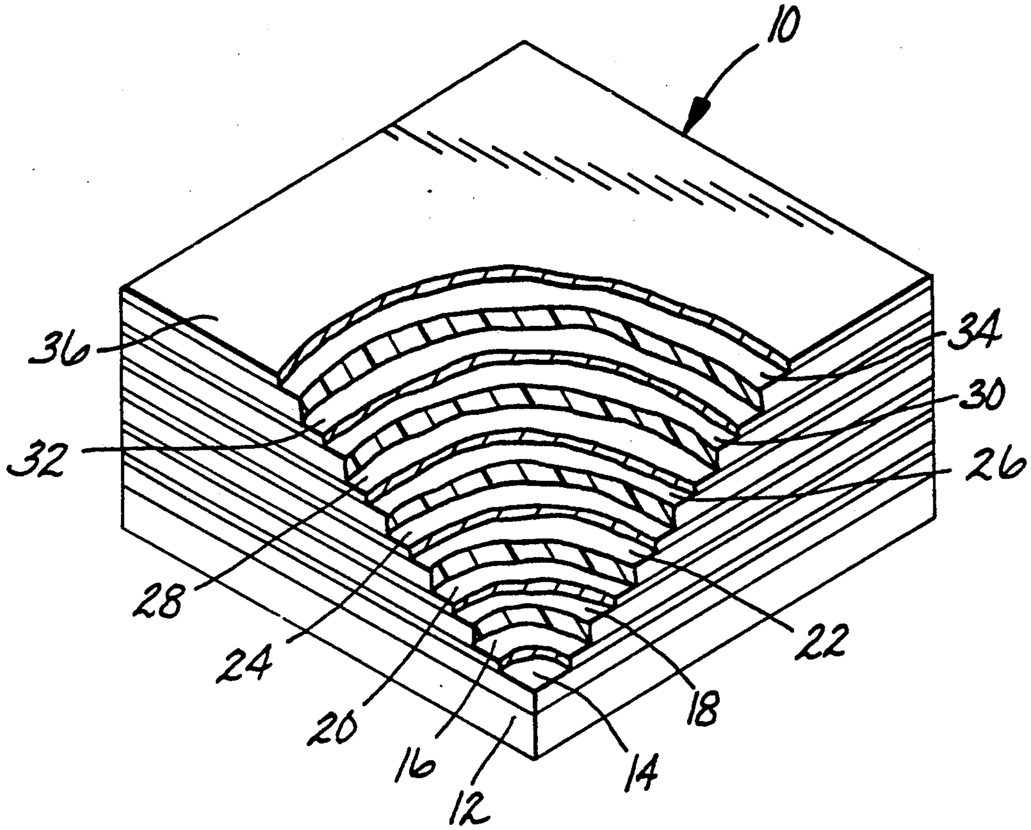
FIG. 1 is a partially broken away perspective view of one embodiment of the marker of the present invention.

FIG. 1 shows a magnetic electronic article surveillance (EAS) marker of the present invention. In that figure, it can be seen that the marker 10 comprises a substrate 12 which is a film of a thin, flexible polymer, such as a polyimide or polyester. Preferably, a polymer having high temperature characteristics is selected so as to withstand elevated temperature requirements as may be present during the deposition of deposited layers as described hereafter. One such particularly preferred substrate would, therefore, be polyimide and like polymers.

On top of the substrate 12 is deposited a laminate consisting of a plurality of alternating layers of ferromagnetic thin films and nonmagnetic thin-films, respectively. Thus, for example, a first magnetic film 14 may be desirably deposited directly onto the substrate. Alternatively, not shown in FIG. 1, an initial adhesion promoting primer layer may also be first deposited onto the substrate. Also, whether the first deposited film is magnetic or nonmagnetic may be determined based on process preferences, substrate compatibility, etc. The first magnetic thin film 14 may thus, for example, be a nickel iron composition having a composition corresponding to that generally referred to as permalloy and may be deposited to have a thickness in the range of 10 to 1000 nanometers, thicknesses in the range of 100 nanometers being particularly preferred.

On top of the first magnetic thin-film 14 may then be deposited a nonmagnetic thin-film 16. Such a film may be readily formed from an oxide of silicon, aluminum, and the like, as may readily be formed by evaporation, sputtering, sublimation, etc. The nonmagnetic thin-film 16 may desirably have thickness of 5 nm to 50 nm, with a thickness of about 15 nanometers being particularly preferred. On top of the nonmagnetic film 16 may subsequently be deposited a second magnetic film 18 having the same composition as the first film 14 and typically a similar thickness. Likewise, on top of the second magnetic film 18 may be subsequently deposited a second nonmagnetic film 20, having similar composition and thicknesses as that of the first nonmagnetic film 16. Additional alternating pairs of magnetic and nonmagnetic thin-films, such as the magnetic films 22, 26, 30, and 34, and nonmagnetic films 24, 28, and 32, may be subsequently deposited in like manner, the total number of film-pairs being ultimately limited by the functional requirements of the EAS system in which the marker is intended to be used. For example, additional magnetic thin-films will increase the overall signal which may thereby be obtained such that one would thus expect additional layers to be generally desired. However, as the total thickness of all of the combined layers increases, and depending upon the frequency of operation of the EAS system with which a given marker is intended to be used, demagnetization effects will ultimately result in a degradation of the obtained signal, such that any further increases in the number of layers may be undesired.

The processes for depositing the respective magnetic and nonmagnetic thin-films are typical of those generally used in conventional thin-film processes. For example, where polycrystalline permalloy-like thin-films are desired, such films may be sputter-deposited. Thus, in one example, a desired film was obtained with a L.M. Simard Trimag, Triode Magnetron sputtering source utilizing a 5.7 cm diameter permalloy sputtering cathode having a composition of approximately 14.5 wt. % Fe, 4.5 wt. % Mo, 80 wt. % Ni, and 0.5 wt. % Mn. A substrate may be transported directly beneath the permalloy cathode at a distance therefrom of 5.5 Cm. Depositions were performed in an argon partial pressure of 8 milliTorr, with a background pressure of 0.45 microTorr. Sputtered permalloy thin-films up to several hundred nm thick were obtained. The resultant magnetic properties of the film were found to be strongly dependent upon the presence of a very high frequency bias potential, such as, for example, a 13.56 MHz bias frequency at 50 watts incident power while the substrate is held at a negative 250 volt NiFe DC bias.

In an alternative embodiment, thin-films of NiFe have also been deposited by an electron beam evaporation process using commercial Edwards Temescal electron beam guns. In order to permit lengthy depositions onto a continuous web with good compositional control, the guns were fed using a Temescal wire feed apparatus, using wire having a nominal composition of 81.5% wt. % Ni and 18.5 wt. % Fe. This composition was selected so that a film with near zero magnetostriction and low anisotropy energy density would result, markers made with such films being particularly desirable as they may be applied to three-dimensional articles without signal degradation. The power applied to the guns was varied to give desired film deposition rates. Shutters and baffles were also employed to achieve a nearly normal incidence of the evaporant onto the polyimide web. Chemical analysis of the films resulting from this process confirmed that a desired nominal composition corresponding to permalloy was achieved. Under such conditions, a number of NiFe films, ranging in thickness from 0.3 to 1.25 um, were deposited onto 25 and 50 um thick polyimide substrates. For example, a first example was produced with seven films of about 70 nanometers thick sputtered NiFe, with each film separated by a 5 nm thick film of $SiO_x$.

As noted above, the interlying nonmagnetic thin-films may be formed by depositing silicon or aluminum oxides in a variety of methods. In particular, a desired raw material for the $SiO_x$ depositions was found to be commercially available silicon monoxide chips approximately 6 mm in size. The films were thermally deposited using a technique similar to that described by Maissel and Glang in *Handbook of Thin Film Technology*, McGraw Hill, New York 1970. No special attempt was made to maintain a stoichiometric ratio of Si to 0, but the resultant composition was close to SiO stoichiometry. The deposition rate was controlled by adjusting the temperature of the deposition crucible. In the films described, the first layer deposited onto the polyimide was $SiO_x$. Subsequent layers alternated between $SiO_x$ and NiFe. In general, the final layer of the multi-layered laminate was also $SiO_x$.

In a particularly preferred embodiment, the thin-film markers of the present invention are desirably prepared in a conventionally-designed vacuum system into which was incorporated a vacuum compatible web drive assembly. The vacuum system included separate chambers for web unwinding, rewinding, NiFe deposition, and $SiO_x$ deposition.

Such a continuous deposition system thus includes a conventional vacuum pump for evacuating the chambers to a base pressure of less than $5\times10^{-6}$ Torr. The pressure during the various deposition steps was maintained at approximately $1\times10^{-5}$ Torr. This vacuum was obtained through the use of a combination of roughing and high vacuum pumps in a conventional manner. In particular, a combination of turbomolecular and cryogenic pumping is desirably employed.

The substrates utilized in the examples described herein were generally polyimide webs ranging between 25 and 50 um thick. Such a material was selected because of its superior mechanical properties, including stability at elevated temperatures. Alternative substrate materials may include thin metallic foils of nonmagnetic stainless steel, aluminum, and copper. As, however, polyimide is highly hygroscopic, retaining about 1 percent by weight of water, it is well-known to those skilled in the art that it is necessary to outgas such films prior to deposition. Such outgassing was obtained by passing the substrate films within the vacuum chamber three times at a rate of approximately 60 cm per minute over a roller heated to 315° C. Other techniques, such as passing the web near heat lamps, while in vacuum, are also known to be effective.

The respective alternating magnetic and nonmagnetic films of the laminates described herein were deposited on the polyimide substrate while it was moving on a heated drum. Drum temperatures in the range of 270 to 315° C. have been found to be particularly desirable for forming a high quality adherent film without unacceptably degrading the polyimide. The films described herein were produced at drum temperatures of approximately 290 to 300° C.

Desirable thin-film markers producing signals very rich in high order harmonics were obtained when highly anisotropic laminates were prepared and interrogated along the easy axis of magnetization. Such a high degree of anisotropy was found to be readily produced in the NiFe films if an aligning magnetic field was present during the deposition process. Such fields must be of an amplitude sufficient to magnetically saturate the growing films. Generally, a field of 8,000–16,000 A/m was found to be sufficient. Such a field was applied in the cross web direction during the deposition.

The multi-layer laminates described herein were thus built up by transporting the polyimide web past the respective deposition stations as many times as appropriate to produce the desired number of layer pairs of $SiO_x$ and NiFe. In general, it was found that a film transport at a rate of 6–15 m per minute produced desirable multi-layer laminates. It will be apparent to those skilled in the art that both faster and slower rates may be achieved with appropriate modifications to the deposition conditions. The following examples are exemplary of multi-layer laminates thus prepared.

A first example comprised a thin film laminate consisting of 10 layer pairs, with each NiFe film being approximately 92 nanometers thick, while the $SiO_x$ films were each about 14 nanometers thick. The film laminates were deposited onto a 15 cm wide, 50 um thick polyimide substrate. The resulting composite, when measured along the easy axis, was found to have a coercive force less than 80 A/m and produced a signal approximately 4 times that generated by comparable sized Quadratag TM markers when measured in a simulated EAS system.

A second example comprised a film laminate consisting of 15 layer pairs. In this example, each of the NiFe films were approximately 80 nanometers thick, with the $SiO_x$ layer films each about 14 nanometers thick. The film was again deposited on a 15 cm wide 50 um thick polyimide substrate. The resulting multi-layer laminate also displayed highly anisotropic properties, having a coercive force of less than 80 A/m. Again, very high order harmonic signals were obtained for this sample with processed signal intensities being about 4 times that obtained for a comparable QuadraTag TM marker.

In a third example, film laminates were prepared consisting of 13 layer pairs, in which each of the NiFe films were approximately 67 nanometers thick and the $SiO_x$ films were each about 15 nanometers thick. As before, this film laminate was deposited onto a 15 cm wide 50 um thick polyimide substrate. The resulting laminate displayed a similarly high degree of anisotropy with a coercive force of less than 80 A/m, and was found to generate a signal particularly rich in high order harmonics, such that the signals obtained in the simulated EAS system were approximately 6 times that obtained from comparable QuadraTag TM markers.

Because of the particularly high degree of anisotropy present, it was found that this film laminate could be readily used to form a bi-directional marker by laminating two pieces of the films together with the easy axis directions rotated 90 degrees with respect to each other. When such a two-laminate construction was tested, the signal strength was found to be reduced by about 10 percent from that for the individual samples of the 13-layer laminate It was also found that samples, having a lesser degree of anisotropy laminated together with the respective laminates rotated 90 degrees with respect to each other, resulted in an even larger degradation of the signal.

In a fourth example, a film laminate was prepared consisting of seven layer pairs in which the NiFe films were approximately 70 nanometers thick and the $SiO_x$ layers were about approximately 5 nanometers thick. This laminate was deposited onto a 40 cm wide, 25 um thick polyimide substrate. The resulting composite was also found to be highly anisotropic, having a coercive force of less than 80 A/m, and produced high harmonic signals having an intensity in the simulated EAS system of about 3 to 4 times that of comparable QuadraTag TM markers.

In a fifth example, 9 layer pairs of NiFe and $SiO_x$ were obtained, in which NiFe layer films approximately 70 nanometers thick, and $SiO_x$ layers approximately 5 nanometers thick were deposited onto a 40 cm wide, 25 um thick polyimide substrate. The resulting composite was also found to be highly anisotropic, having a coercive force below 40 A/m. Again, very high order harmonic signals resulted, having an intensity of approximately 4 times that for comparable QuadraTag TM markers.

Figure 2:
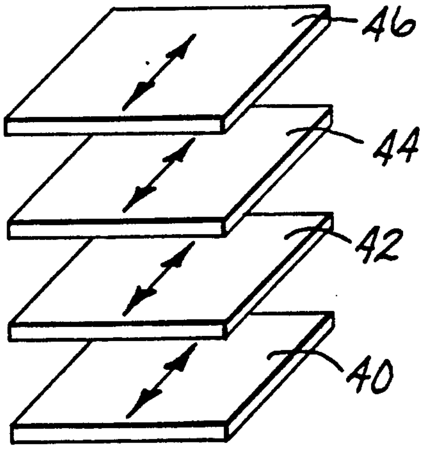
FIGS. 2 and 3 are exploded, partial perspective views showing different alignments of anisotropic films contained in different embodiments of the present invention.

As noted above, and as particularly illustrated in FIG. 2, in a preferred embodiment, the respective magnetic films of the laminates have a single, in-plane preferred axis of magnetization, along which a higher differential permeability is observed. Thus, as shown in FIG. 2, each of the respective magnetic films 40, 42, 44, and 46, were deposited under the same conditions in which a magnetic field was applied transverse to the length of the web so that the deposited films had a single preferred axis perpendicular to the direction of the web and had a common dynamic coercive force. Accordingly, the preferred axis of all of the respective films were in the direction of the double-headed arrows as there are shown. A marker thus formed from the multilayer laminate produces its maximum signal when the interrogation fields of the EAS system are substantially parallel to the preferred axis as shown by those arrows.

Figure 3:
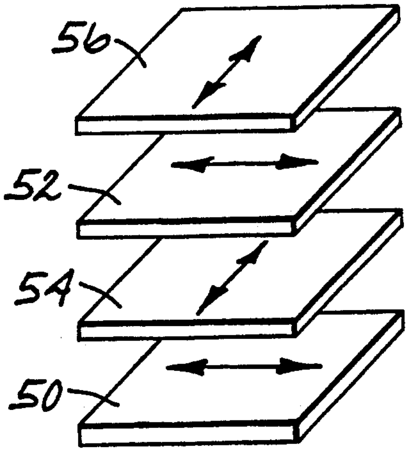

FIG. 3 shows an alternative embodiment in which the magnetic films 50 and 52 were formed with a bias field along the length of the web of the film such that easy axis of magnetization was along the direction of the double-headed arrows shown with respect to those respective films, while the intervening films 54 and 56 were prepared as described above in which the bias field was applied transverse to the direction of the web so that the easy axis is perpendicular to the coating direction as shown by the double arrows associated with the films 54 and 56.

In alternative embodiments of the present invention, markers may be formed from multi-layer magnetic films in which the magnetic films are made from amorphous compositions consisting essentially of boron, one or more of the metalloid groups consisting of silicon, phosphorous, carbon, and germanium, and one or more of the transition element group consisting of cobalt, nickel, iron, and manganese. Selected examples of such amorphous compositions exhibit substantially isotropic magnetic properties in all in-plane directions, thereby providing a marker whose detectability is less direction sensitive than those described hereinabove. Even though the magnetization and differential permeability of the isotropic layers tend to be lower than that for the anisotropic materials primarily described herein, the insensitivity to orientation is sufficiently important in selected applications to compensate for this difference. Another advantage is the lower electrical conductivity of such amorphous compositions. A preferred amorphous composition includes silicon as the metalloid, with the combined weight of boron and silicon ranging from 15 to 30 atomic percent of the total amorphous composition. Transition elements preferably include iron, nickel, cobalt, and manganese, with the cobalt composition ranging between 60 and 75 percent of the total (cobalt-containing amorphous composition).

Figure 4:
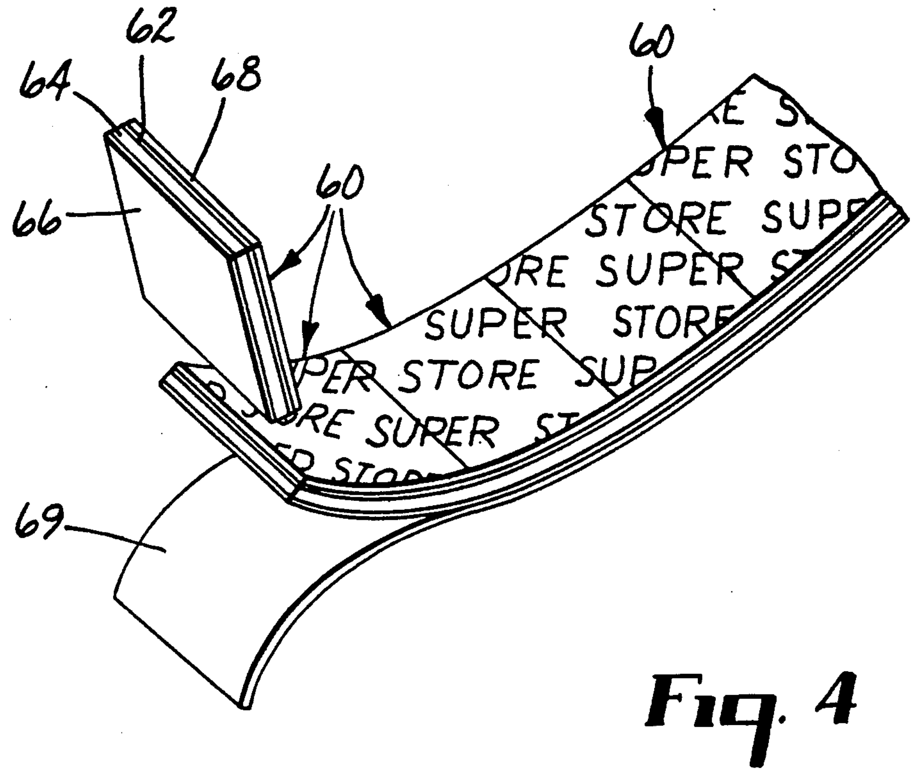
FIG. 4 is a perspective view of a strip of markers according to the present invention.

A preferred way of distributing the markers shown in FIG. 1, is shown in FIG. 4. As may there be seen, the markers 60 comprise the multi-layer laminate 62 deposited upon a substrate 64. The laminate-substrate is in turn covered with a pressure sensitive adhesive layer 66, to enable the resultant markers to be attached to objects to be protected. Similarly, the markers include a top layer 68, which both protects the magnetic laminate and provides a printable surface on which customer indicia may be printed. The top layer 68 is desirably adhered to the laminate 62 using conventional adhesives. Finally, the markers 60 are carried by a release liner 69, thereby enabling a strip of the markers to be dispensed in a conventional dispensing gun for application to articles such as in retail stores and the like.

Figure 6:
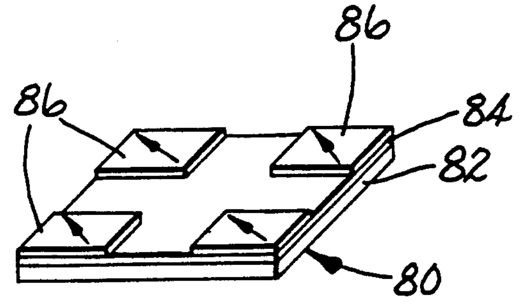
FIGS. 5 and 6 are perspective views of deactivatable markers according to the present invention.
Figure 5:
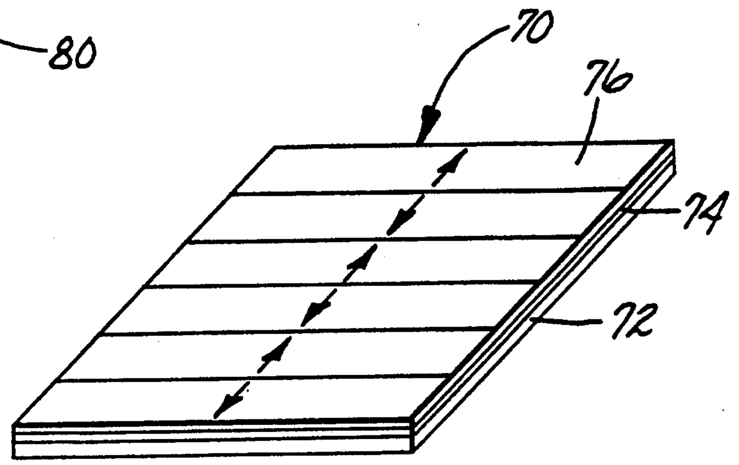

In a preferred embodiment, the markers of the present invention may similarly be desirably provided in a dual status form. Thus, as shown in FIGS. 5 and 6, such a dual status capability may be provided by including with the markers previously described at least one remanently magnetizable element. As shown in FIG. 5, such a marker 70 may include a substrate 72 on which a laminate 74 of a plurality of alternating magnetic and nonmagnetic layers may be deposited as described above. Further, the marker 70 includes a layer 76 consisting of a sheet of remanently magnetizable material such as a thin foil of magnetic stainless steel, vicalloy, a dispersion of gamma iron oxide particles, etc. A preferred construction utilizes Arnokrome TM, an Fe, Co, Cr, and V alloy marketed by Arnold Engineering Co., Marengo, Illinois, such as the Alloy "A" described in U.S. Pat. No. 4,120,704 assigned to that company. To deactivate such a marker, an appropriate magnetic pattern would then be imposed on the magnetizable sheet 76, such as the bands of alternating magnetic polarities shown by the oppositely directed arrows in FIG. 5.

In the alternative embodiment shown in FIG. 6, a desensitizable marker 80 may be constructed of an appropriate substrate 82 on which is deposited a laminate 84 comprising alternate layers of magnetic and nonmagnetic films as described hereinabove. In the embodiment of FIG. 6, the continuous magnetizable sheet 76 of FIG. 5 is replaced by discrete pieces of magnetizable material 86. As the boundaries between the pieces of materials themselves define the extremities of the magnetic dipoles that may be formed in each of the pieces, such a marker may be desensitized by merely magnetizing each of the individual pieces in the same direction as shown by the single headed arrows shown in that figure.

What is claimed is:

1. A marker for use with a magnetic-type electronic article surveillance system, which system produces in an interrogation zone alternating magnetic fields having average peak intensities of a few oersteds, said marker having a high permeability and a coercive force sufficiently low so as not to retain any given magnetization state and less than the average intensity encountered in said zone, such that upon exposure to such fields, the magnetization state of the marker is periodically reversed and a remotely detectable characteristic response is produced, said marker comprising:

(a) a sheet-like, flexible substrate;

(b) a plurality of magnetic thin-films deposited on said substrate, each of said magnetic thin-films having substantially the same high permeability and low coercive force; and (c) a non-magnetic thin-film between each pair of adjacent magnetic thin-films, each said non-magnetic thin-film having a thickness not less than one nm and not more than that of the adjacent magnetic thin-films so as to allow magnetostatic coupling between adjacent magnetic thin-films, and yet sufficiently thick to inhibit exchange coupling between adjacent magnetic films, whereby magnetization states in all of said magnetostatically coupled magnetic thin-films may reverse substantially as a single entity upon exposure to said interrogation fields and thus produce a said response which is sharp and readily distinguishable.

2. A marker according to claim 1, wherein said substrate and thin-films are substantially rectangular, having a ratio of major to minor length not exceeding three.

3. A marker according to claim 2, wherein said ratio is one.

4. A marker according to claim 1, wherein said substrate comprises a polymeric material.

5. A marker according to claim 4, wherein said polymeric material is selected from the group consisting of polyimides and polyesters.

6. A marker according to claim 1, comprising magnetic thin-films having significantly anisotropic magnetic properties.

7. A marker according to claim 6, wherein an easy axis of magnetization associated with all magnetic thin-films is substantially the same direction such that the marker exhibits a substantially undirectional response.

8. A marker according to claim 6, wherein an easy axis of magnetization associated with some of the magnetic thin-films is substantially perpendicular to that of other magnetic thin-films such that the marker exhibits a substantially bi-directional response.

9. A marker according to claim 6, wherein a first plurality of magnetic thin-films have a first easy axis of magnetization and a second plurality of magnetic thin-films have an easy axis of magnetization different from said first axis.

10. A marker according to claim 1, comprising magnetic thin-films formed of a nickel and iron alloy.

11. A marker according to claim 1, wherein said magnetic thin-films exhibit substantially zero magnetostriction.

12. A marker according to claim 1, comprising substantially amorphous magnetic thin-films.

13. A marker according to claim 1, further comprising at least one remanently magnetizable layer, which when magnetized, magnetically biases the magnetic thin-films and thereby alters said response, thereby causing the marker to alternately have a sensitized and de-sensitized state, depending upon whether the magnetizable layer is magnetized or demagnetized.

14. A marker according to claim 1, further comprising an adhesive layer for enabling the marker to be affixed to articles to be protected.

15. A marker according to claim 14, still further comprising a release liner for protecting the adhesive layer prior to application to said article.

16. A marker for use with a magnetic-type electronic article surveillance system, said marker comprising:

(a) a flexible substrate;

(b) a plurality of magnetic thin-films deposited on said substrate, each of said magnetic thin-films having substantially the same high permeability and low coercive force so as to enable a state of magnetization therein to reverse upon exposure to low intensity, alternating magnetic fields typically associated with said system and having significantly anisotropic magnetic properties, wherein an easy axis of magnetization associated with some of the magnetic thin-films is substantially perpendicular to that of other magnetic thin-films such that the marker exhibits a substantially bi-directional response; and (c) a non-magnetic thin-film between each pair of adjacent magnetic thin-films, said non-magnetic thin-films having a thickness not less than one nm and not more than that of the adjacent magnetic thin-films, so as to allow magnetostatic coupling between adjacent magnetic thin-films, and yet sufficiently thick to inhibit exchange coupling between adjacent magnetic films, whereby magnetization states in all of said magnetostatically coupled magnetic thin films may reverse substantially as a single entity upon exposure to an alternating interrogation field of a said system and produce a sharp, readily distinguishable response.

17. A marker for use with a magnetic-type electronic article surveillance system, said marker comprising:

(a) a flexible substrate;

(b) a plurality of magnetic thin-films deposited on said substrate, each of said magnetic thin-films having substantially the same high permeability and low coercive force so as to enable a state of magnetization therein to reverse upon exposure to low intensity, alternating magnetic fields typically associated with said system and having significantly anisotropic magnetic properties, wherein a first plurality of magnetic thin-films have a first easy axis of magnetization and a second plurality of magnetic thin-films have an easy axis of magnetization different from said first axis; and (c) a non-magnetic thin-film between each pair of adjacent magnetic thin-films, said non-magnetic thin-films having a thickness not less than one nm and not more than that of the adjacent magnetic thin-films, so as to allow magnetostatic coupling between adjacent magnetic thin-films, and yet sufficiently thick to inhibit exchange coupling between adjacent magnetic films, whereby magnetization states in all of said magnetostatically coupled magnetic thin films may reverse substantially as a single entity upon exposure to an alternating interrogation field of a said system and produce a sharp, readily distinguishable response.

* * * * *

UNITED STATES PATENT AND TRADEMARK OFFICE

CERTIFICATE OF CORRECTION

PATENT NO. : 5,083,112

DATED : January 21, 1992

INVENTOR(S) : Piotrowski et al.

It is certified that error appears in the above-identified patent and that said Letters Patent is hereby corrected as shown below:

On the Title Page, item [75] Inventors, "T05083271g-Long" should read --Ching-Long Tsai--.

Column 9, line 19, "undirectional" should read --unidirectional--.

Signed and Sealed this

Thirty-first Day of August, 1993

*Attest:*

BRUCE LEHMAN

*Attesting Officer*

*Commissioner of Patents and Trademarks*